United States Patent
Guo et al.

(10) Patent No.: US 8,409,906 B2
(45) Date of Patent: Apr. 2, 2013

(54) NON-VACUUM METHOD FOR FABRICATION OF A PHOTOVOLTAIC ABSORBER LAYER

(75) Inventors: Wei Guo, Canton, MI (US); Yu Jin, Ann Arbor, MI (US); Bing Liu, Ann Arbor, MI (US); Yong Che, Ann Arbor, MI (US)

(73) Assignee: IMRA America, Inc., Ann Arbor, MI (US)

( * ) Notice: Subject to any disclaimer, the term of this patent is extended or adjusted under 35 U.S.C. 154(b) by 209 days.

(21) Appl. No.: 12/910,929

(22) Filed: Oct. 25, 2010

(65) Prior Publication Data
US 2012/0097224 A1    Apr. 26, 2012

(51) Int. Cl.
*H01L 21/00* (2006.01)

(52) U.S. Cl. ...... 438/72; 438/84; 438/85; 438/E31.033; 136/251; 136/255

(58) Field of Classification Search ............ 438/63, 438/84, 72, 95–96; 136/251, 255; 977/773, 977/948
See application file for complete search history.

(56) References Cited

U.S. PATENT DOCUMENTS

| | | | |
|---|---|---|---|
| 3,879,276 | A | 4/1975 | Underwood |
| 4,204,933 | A | 5/1980 | Barlow |
| 4,225,408 | A | 9/1980 | Barlow |
| 4,482,447 | A | 11/1984 | Mizuguchi |
| 4,482,933 | A | 11/1984 | Alexander |
| 5,660,746 | A | 8/1997 | Witanachchi |
| 5,756,924 | A | 5/1998 | Early |
| 6,060,128 | A | 5/2000 | Kim |
| 6,783,569 | B2 | 8/2004 | Cheon |
| 7,235,736 | B1 | 6/2007 | Buller et al. |
| 7,306,823 | B2 | 12/2007 | Sager |
| 7,604,843 | B1 | 10/2009 | Robinson et al. |
| 7,663,057 | B2 | 2/2010 | Yu |
| 2005/0226287 | A1 | 10/2005 | Shah |
| 2005/0243396 | A1 | 11/2005 | Fujii |
| 2005/0276931 | A1 | 12/2005 | Che |
| 2006/0037641 | A1 | 2/2006 | Kibbel et al. |
| 2006/0086834 | A1 | 4/2006 | Pfeffer |
| 2007/0029185 | A1 | 2/2007 | Tung |
| 2007/0051202 | A1 | 3/2007 | Ragharaman |
| 2008/0041532 | A1 | 2/2008 | Chou |

(Continued)

FOREIGN PATENT DOCUMENTS

| | | |
|---|---|---|
| EP | 0297799 A1 | 1/1989 |
| EP | 1529314 | 5/2005 |

(Continued)

OTHER PUBLICATIONS

S. Anh et al., "Effects of Selenization Conditions on Densification of Cu(In, Ga)Se2 (CIGS) Thin Films Prepared by Spray Deposition of CIGS Nanoparticles" Journel of Applied Physics, 105113533 (2009).

(Continued)

*Primary Examiner* — Dung A. Le
(74) *Attorney, Agent, or Firm* — Dickinson Wright PLLC

(57) ABSTRACT

The present invention provides a non-vacuum method of depositing a photovoltaic absorber layer based on electrophoretic deposition of a mixture of nanoparticles with a controlled atomic ratio between the elements. The nanoparticles are first dispersed in a liquid medium to form a colloidal suspension and then electrophoretically deposited onto a substrate to form a thin film photovoltaic absorber layer. The absorber layer may be subjected to optional post-deposition treatments for photovoltaic absorption.

23 Claims, 6 Drawing Sheets

U.S. PATENT DOCUMENTS

| | | |
|---|---|---|
| 2009/0246413 A1 | 10/2009 | Murakami |
| 2009/0246530 A1 | 10/2009 | Murakami |
| 2009/0305455 A1 | 12/2009 | Leidholm |
| 2010/0133479 A1 | 6/2010 | Huang et al. |
| 2010/0196192 A1 | 8/2010 | Liu |
| 2010/0242800 A1 | 9/2010 | Chuang |
| 2010/0248419 A1 | 9/2010 | Woodruff et al. |
| 2011/0192714 A1 | 8/2011 | Liu |

FOREIGN PATENT DOCUMENTS

| | | |
|---|---|---|
| WO | 8810513 | 12/1988 |
| WO | 2004019420 A1 | 8/2003 |
| WO | 2009117451 | 9/2009 |
| WO | 2010017124 A2 | 6/2010 |

OTHER PUBLICATIONS

S. Anh et al., "Nanoparticle Derived Cu(In, Ga)Se2 Absorber Layer for Thin Film Solar Cells" Colloids and Surfaces, 313-314171 (2008).

C.P. Chan et al., "Preparation of Cu2ZnSnS4 Film by Electrodeposition Using Ionic Liquids" Solar Energy Materials and Solar Cells, 94207 (2010).

M. Kaelin, et al., "CIS and CIGS Layers from Selenized Nanoparticle Precursors" Thin Solid Films, 431-43258 (2003).

V.K. Kapur et al., "Non-Vacuum Processing of CuIn1-xGaxSe2 Solar Cells on Rigid and Flexible Substrates Using Nanoparticle Precursor Inks" Thin Solid Films, 431-253 (2003).

D.L. Schulz et al., Cu-In-Ga-Se Nanoparticle Colloids as Spray Deposition Precursors for Cu(In,Ga) Se2 Solar Cell Materials, 27(5), 433-437 (1998).

International Search Report; 3 Pages Dated Feb. 6, 2012.

Brown et al.: "The mechanism of electrophoretic deposition" J. Appl. Chem., 15, 40 (1965).

S. L. Castro et. al.: Nanocrystalline Chalcopyrite Materials ($CuInS_2$ and $CuInSe_2$) via Low-Temperature Pyrolysis of Molecular Single-Source Precursors, Chem. Mater. 15, 3142 (2003).

M. A. Malik et. al.: "A Novel Route for the Preparation of CuSe and $CuInSe_2$ Nanoparticles" Adv. Mat. 11, 1441 (1999).

Van der Biest et al: "Electrophoretic deposition of materials" Annu. Rev. Mater. Sci. 29, 327 (1999).

JJ. Zhu, "General Sonochemical Method for the Preparation of Nanophasic Selenides: Synthesis of ZnSe Nanoparticles" Chem. Mater., 12, 73, (2000).

S. Barcikowski et al., "Generation of nanoparticle colloids by picosecond and femtosecond laser ablations in liquid flow", Applied Physics Letters, vol. 91, 2007, 083113.

J. Brannon et al.," Laser Processing for Microengineering Applications", Chp 5 in Microengineering Aerospace Systems, editor: H. Helvajian, copyright 1999, pp. 145, 160-162, 187 and 188.

D. F. Huessy at al., "Water, Ultrapure" in Ullmann's Ency. Of Industrial Chemistry, Pub. Oct. 15, 2008, 26 pgs.

I. Lee et al., "Production of Au-Ag alloy nanoparticles by laser ablation of bulk alloys", Chemical Communications, 2001, pp. 1782-1783.

W. E. Nichols et al., "Laser Ablation of a platinum target in water. I. Ablations mechanisms", J of Applied Physics vol. 100, 2006, 114911.

A. Pyatenko et al., "Synthesis of silver nanoparticles by laser ablation in pure water", A. Pyatenko et al., Applied Physics A, vol. 79, 2004, pp. 803-806.

A.V. Simaken et al., "Nanodisks of Au and Ag produced by laser ablation in liquid environment", Chemical Physics Letters vol. 348, 2001, pp. 182-186.

Yang, Li, Chapter 2, "Liquid-Phase Pulsed Laser Ablation" in Self-assemble and Ordering Nanomaterials by Liquid-Phased Pulsed Laser Ablation, Dissertation, Nov. 2007 pp. 33-51.

NON-VACUUM METHOD FOR FABRICATION OF A PHOTOVOLTAIC ABSORBER LAYER

RELATED APPLICATIONS

NONE.

STATEMENT REGARDING FEDERALLY SPONSORED RESEARCH

NONE.

TECHNICAL FIELD

The present invention relates to fabrication of a photovoltaic absorber layer and a photovoltaic device incorporating the layer wherein the photovoltaic absorber layer is fabricated by electrophoretic deposition of nanoparticles of an absorptive material.

BACKGROUND OF THE INVENTION

Recent efforts for fabrication of photovoltaic devices have included developing cost-effective thin film solar cells with reasonable efficiencies as alternatives to traditional silicon-based solar cells. The core structure of such thin film solar cells typically contains a photovoltaic absorber layer of a chalcopyrite or a kesterite compound. An absorber layer made of a chalcopyrite compound typically contains elements from each of groups IB, IIIA, and VIA of the periodic table of elements, including copper and indium and/or gallium or aluminum and selenium and/or sulfur, denoted by Cu, In, Ga, Al, Se and S in commonly accepted chemical symbols. For such materials to perform as p-type solar absorbers and to have the desired carrier type and concentration, the atomic ratio between these group IB:IIIA:VIA elements, e.g., Cu:(In+Ga):Se is strictly controlled near 25%:25%:50% with allowable deviations towards Cu-deficient and Se-rich by percents of plus or minus 15%. This predetermined ratio is known to those of ordinary skill in the art and is adhered to in the design of these solar absorbers. Such absorber layers are often referred to as CIGS layers, and the corresponding devices are referred to as CIGS solar cells. Alternatively, an absorber layer made of a kesterite compound typically contains elements from each of groups IB, IIB, IVA, and VIA of the periodic table of elements, e.g. copper and zinc and tin and selenium and/or sulfur, denoted by $Cu_2ZnSn(S,Se)_4$. Such absorber layers are often referred to as CZTS layers, and the corresponding devices are referred to as CZTS solar cells. The atomic ratio between these group IB:(IIB+IVA):VIA elements, e.g. Cu:(Zn+Sn):(S+Se) is also strictly controlled near the predetermined ratio of 25%:25%:50%, with allowable deviations also towards slightly Cu-deficient and (S+Se)-rich by a few percents of plus or minus 15%.

Conventional vacuum-based techniques for depositing the absorber layer include evaporation, sputtering, chemical vapor deposition, and the like. The vacuum-based techniques provide for a well-controlled film composition and composition gradient and they yield absorber layers with high conversion efficiencies. These techniques, however, are of limited use because they require significant capital investment, involve complicated deposition procedures, and result in excessive waste of raw materials. In addition, vacuum-based techniques are not well matched to the large-scale and high-yield industrial manufacturing demand in the light of increasing solar cell panel size.

Generally, non-vacuum techniques are alternative techniques for depositing the absorber layer. These include electrodeposition, spray pyrolysis, paste coating, drop casting, screen printing, and the like. These techniques generally include a wet-process comprising providing a solution, suspension, ink, paste, or paint, which contains absorber precursor materials and may be rapidly coated into a thin layer on a substrate. The precursor layer is then heat-treated to form a polycrystalline absorber film by annealing and/or selenization or sulfurization in a reactive gas of ambient or evaporated selenium or sulfur vapor. The non-vacuum-based techniques are more favorable than the vacuum-based techniques because they provide high efficiencies in raw material utilization, fast and simple deposition procedures, low capital investment and processing costs, and possibilities for manufacturing scale-up. In addition, flexible substrates may be incorporated into these techniques.

One of the most important parameters in fabrication of high quality solar absorber layers is precise control of the chemical composition of the absorber layer, which is critical for providing the absorber layer with a desired crystal structure, a desired electrical conductance, and strong optical absorption in the solar spectrum. In this regard, the non-vacuum techniques have many drawbacks which include: poor reaction controllability; low crystal structure quality; low packing density of the absorber layer; adhesion loss at the absorber layer/substrate interface; and unavoidable impurity contaminations from many reaction additives such as residual reactants, by-products, surfactants, dispersants, and binders etc. which are required in a given process.

To solve these problems, one choice of non-vacuum methods is to synthesize nanoparticles in solution with a chemical composition that is appropriate for solar absorption by carrying out a wet reaction process followed by precipitation of the nanoparticles. U.S. Pat. No. 7,663,057 and U.S. Pat. No. 7,306,823 teach several methods of preparation of nanoparticles in solution that can contain the desired elements with an appropriate atomic ratio between the elements. However, just to synthesize these particles can require well over 48 hours of reaction time as shown in several examples in U.S. Pat. No. 7,663,057. These nanoparticles are then mixed with various additives to form a viscous paste or slurry or ink that can be coated onto a substrate to form a thin film. In these methods, although the nanoparticles have the desired composition, the chemical synthesis of these nanoparticles and the subsequent making of a paste or an ink both require large amounts of additives such as salt precursors, surfactants, binders, emulsifiers, thickening agents, and anti-foaming agents. The synthesis requires additional processing steps such as high temperature heating to remove these extraneous reagents and to form the final absorber layer. In addition, the above mentioned binders, thickening agents, and anti-foaming agents are mostly polymers that contain long chains of carbohydrate. Complete removal of these materials often requires annealing of the absorber layer under an oxygen-rich environment. This annealing process increases the risk of oxidizing the absorber layers, which are mostly sulfides, selenides, and tellerides. The oxidation damages the absorber layer and reduces the device's efficiency.

One method of forming a thin film, electrophoretic deposition (EPD), is a broadly acknowledged non-vacuum coating method employed in automotive, appliance, and general organic industries. During the process of EPD, surface-charged particles suspended in a liquid medium will migrate under the influence of an external electric field and be rapidly deposited onto an electrically conductive or semi-conductive surface having the opposite charge. High density films of metals, ceramics, polymers, semiconductors, or carbon have been deposited as described in the prior art such as in "*The mechanism of electrophoretic deposition*" by Brown and Salt in J. Appl. Chem., 15, 40 (1965), and in U.S. Pat. Nos. 3,879, 276; 4,204,933; 4,225,408; and 4,482,447. The above described prior art all require delicate procedures for making the nanoparticle suspension in solution, which involves chemical synthesis such as a metathetical reaction or a reduction reaction to form the nanoparticles, and the described EPD processes typically required assistance of specific acids or bases, stabilizers, and/or binding agents. In addition, some of the described processes required use of post-deposition high temperature treatments at 300 to 800° C. to form the final film as described in U.S. Pat. Nos. 4,204,933 and 4,225,408. These delicate procedures disclose vulnerability and complexity in EPD process control and increase the processing cost accordingly. In addition, the use of chemical reactants and assisting additives will inevitably result in waste of raw materials and introduce chemical contaminations into the suspension and onto the deposited film. Thus, an EPD process has not found use in the highly desired production of large-scale solar panels.

It is highly desirable to provide a cost-effective, practical, and simple method for forming photovoltaic absorbing layers. Preferably the method requires minimum chemical additives during both formation of the nanoparticles and the subsequent coating of the nanoparticles onto a substrate to form a photovoltaic absorber layer. The method must ensure that the resultant absorber layer contains the desired chemical composition.

SUMMARY OF THE INVENTION

It is an object of the present invention to provide a non-vacuum-based method of depositing a photovoltaic absorber layer onto a substrate for use in a photovoltaic device, which is simple, cost-effective, and has minimal impurity contamination. According to a broad aspect of the invention, a method is provided comprising the steps of: providing nanoparticles comprising a combination of either one or more elements of groups IB, most preferably Cu, and IIIA with the option of including one or more group VIA elements or one or more elements of groups IB, most preferably Cu, and IIB and/or IVA with the option of including one or more group VIA elements; producing a colloidal suspension of the nanoparticles that are surface-charged in a liquid medium comprising at least one solvent and optionally an additive; depositing the surface-charged nanoparticles onto a substrate using an EPD process to form a dense thin film of the same material; and then optionally, further transforming the thin film photovoltaic absorber layer, by using a post-deposition treatment such as chalcogenization and annealing.

According to one aspect of the present invention, a unique non-vacuum method of depositing a photovoltaic absorber layer onto a substrate includes physically breaking down a bulk source of the absorber materials into nanoparticles and then using EPD to deposit the nanoparticles onto a substrate. Compared to prior non-vacuum thin film deposition methods such as chemical reaction involved formation of nanoparticles followed by EPD and other non-EPD methods, the method of the present invention has significant advantages in providing high quality and process controllability, maximizing source material usage, and reducing process complexity and impurity contamination.

The above and other objects, features, and advantages of the present invention will be readily understood from the following detailed description taken in conjunction with the accompanying drawings.

DETAILED DESCRIPTION OF A PREFERRED EMBODIMENT

Although the following description is given for preferred embodiments of the invention for the purposes of illustration, it will be apparent that many variations and modifications can be effected by anyone of ordinary skill in the art without departing from the scope of the invention. Accordingly, the exemplary embodiments of the invention described below are set forth without any loss of generality to, and without imposing limitations on, the claimed invention.

In the present application, the following terms are defined as below, unless indicated otherwise.

"Nanoparticles" refers to particles having a size ranging from about 1 nanometer (nm) to 500 nm in at least one dimension.

"Surface-charged particles" refers to nanoparticles having a shield of charges at the interface between the particle surface and the surrounding liquid medium.

"Colloidal suspension" refers to a liquid system wherein surface-charged particles are microscopically suspended due to the electrostatic repel forces between the surface-charged particles.

Embodiments of the present invention provide a non-vacuum method of depositing a photovoltaic absorber layer onto a substrate for use in a photovoltaic device. While we do not exclude the possibility that electrodeposition, spray pyrolysis, paste coating, drop casting, screen printing, and the like may be used, at least in the past, for deposition, preferably the absorber layer is deposited by electrophoretic deposition (EPD), more particularly, preferably by EPD of a colloidal suspension comprising surface-charged nanoparticles in a liquid medium, wherein the nanoparticles are formed by physically breaking down a bulk solid of the same material. The EPD process may optionally be followed by post-deposition treatments.

Figure 1:
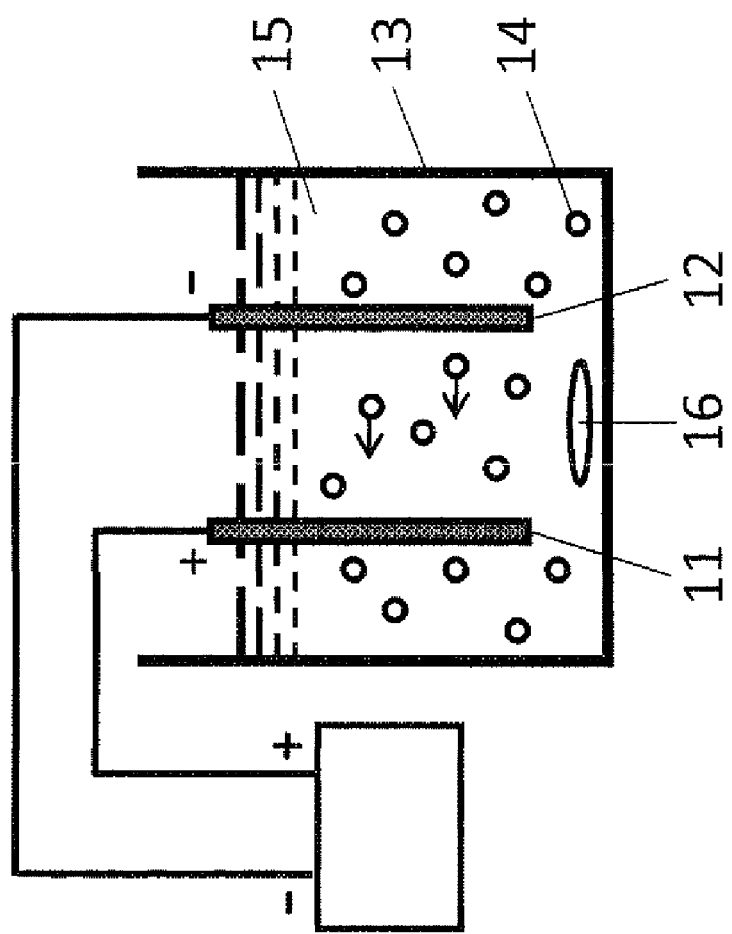
FIG. 1 is a schematic diagram showing an apparatus for carrying out an electrophoretic deposition of a colloidal suspension prepared according to an embodiment of the present invention.
Figure 2:
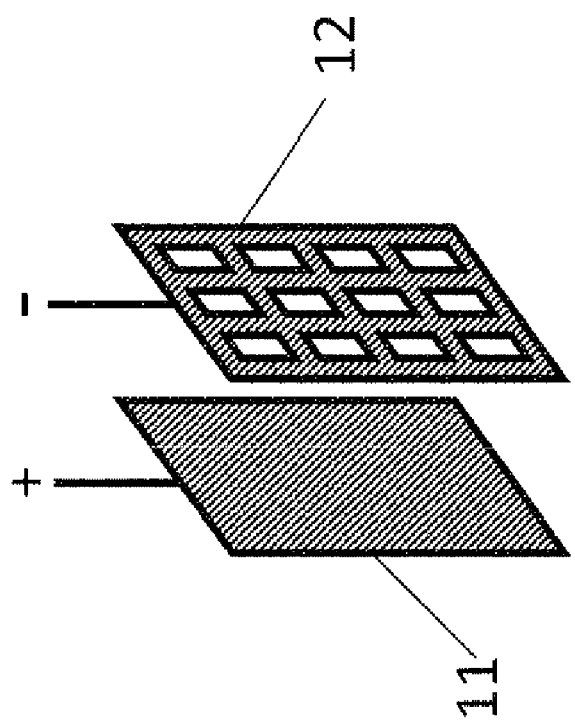
FIG. 2 is a schematic diagram showing a trimetric view of the electrodes in the apparatus of FIG. 1 according to an embodiment of the present invention.
Figure 3:
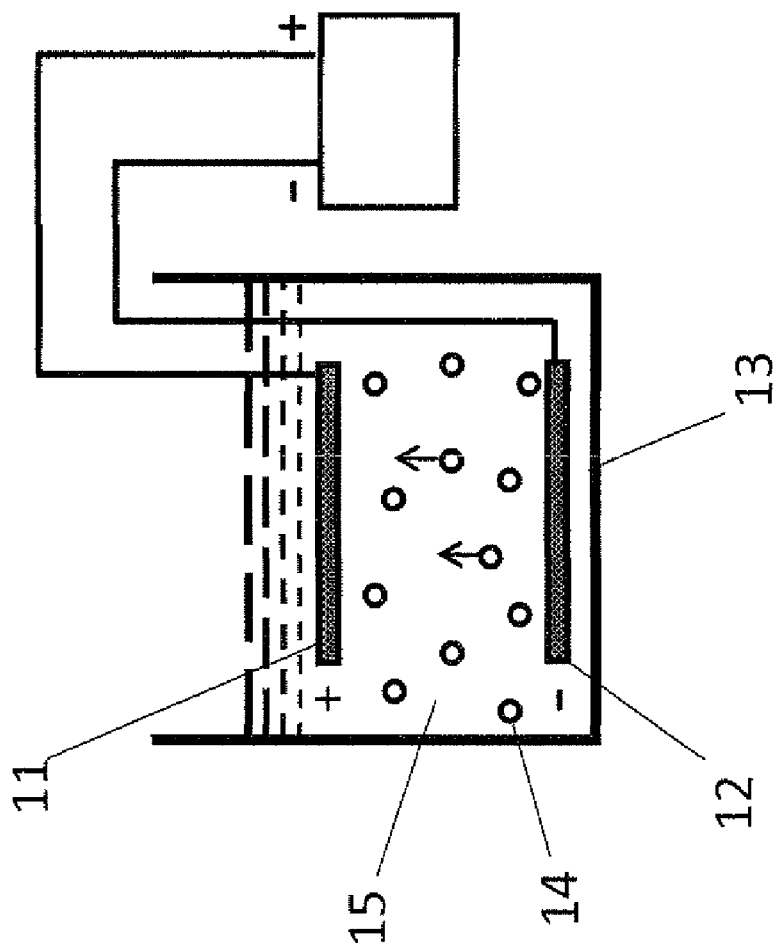
FIG. 3 is a schematic diagram showing an alternative horizontal positioning of the electrodes according to an embodiment of the present invention.

During the process of EPD, surface-charged particles suspended in a liquid medium will migrate under the influence of an external electric field and be deposited onto an electrically conductive or semi-conductive surface, usually charged oppositely to the particles, herein referred to as the "deposition electrode" or substrate. The migration is ultimately caused by the presence of the surface charge of the particles relative to the suspension medium. FIG. 1 is a schematic of an apparatus for carrying an EPD process according to the present invention. An electrical potential is applied across the deposition electrode 11 (e.g. + or − electrode) and the counter electrode 12 (e.g. − or + electrode). Both electrodes 11 and 12 are immersed in a container 13 holding the colloidal suspension, which comprises a plurality of surface-charged nanoparticles 14 (e.g. negatively-charged nanoparticles) and the liquid medium 15. Typically the suspension is stirred during deposition using a stirrer 16. When the nanoparticles 14 gain sufficient kinetic energy from the applied electric field between the electrodes 11 and 12, they will reach the deposition electrode 11 where their charges will be neutralized. The nanoparticles 14 will then be deposited on the deposition electrode 11 and form a close-packed thin film of the same material after the electrode 11 is taken out and dried. FIG. 2 shows a trimetric view of the electrodes, 11 and 12. FIG. 2 also illustrates that the counter electrode 12 may have a shape of a mesh or a grid with hollow center areas, or other shapes, to create the proper electrical field distribution and/or nanoparticle flow density to ensure a uniform deposition on the deposition electrode 11. FIG. 3 shows an alternative apparatus wherein the electrodes 11 and 12 are placed horizontally, which may be an option for manufacturing scale-up.

Generally, nanoparticle materials suitable for an EPD method include, but are not limited, to metals, alloys, semi-conductors, ceramics, glass, polymers, or carbon. According to an embodiment of the present invention, and without loss of generality, the absorber layers for use in photovoltaic devices may be made from a mixture of nanoparticles comprising a combination of elements of groups IB, most preferably Cu, and IIIA, and optionally VIA of the periodic table of elements. In another embodiment, the mixture can comprise a combination of elements of groups IB, most preferably Cu, and IIB and/or IVA and optionally VIA elements of the periodic table of elements. The group IB elements preferably include copper (Cu), silver (Ag), or gold (Au). Group IIIA elements suitable for use in the method of this invention include aluminum (Al), gallium (Ga), and indium (In). Preferably the group IIIA elements are Ga and In. Group IIB elements suitable for use in this invention include zinc (Zn), cadmium (Cd), and mercury (Hg). Preferably the group IIB element is Zn. Group IVA elements suitable for use in this invention include silicon (Si), germanium (Ge), tin (Sn) and lead (Pb). Preferably the group IVA element is Si or Sn. Group VIA elements suitable for use in various embodiments include selenium (Se), sulfur (S), and tellurium (Te). For convenience in description, elements that are possibly able to be combined or interchanged are commonly put in a set of parentheses, for example, (Al,Ga,In) or (S,Se,Te). The nanoparticles may contain one material or a mix of two or more materials from elemental metals, binary or ternary alloys, and binary or ternary or quaternary compounds. For convenience, hyphen ("-") is used to connect elements together and indicates all known binary, ternary, or quaternary alloys or compounds of the elements joined by the hyphen. For example, "Cu—In" indicates all know binary alloys that include both Cu and In elements such as $Cu_2In$, $Cu_4In$, $Cu_{11}In_9$, and the like. Preferably, nanoparticles used in the method of the present invention comprise one or more of the following materials: Cu, Ag, Ag, Al, Ga, In, Zn, Si, Sn, S, Se, Te, Cu—Ag, (Al,Ga)—In, (Cu,Ag)—(Al,In,Ga), (Cu,Ag)—Zn, (Cu,Ag)—(Si,Sn), Zn—(Si,Sn), (Cu,Ag)—(S,Se,Te), (Al, Ga,In)—(S,Se,Te), Zn—(S,Se,Te), (Si,Sn)—(S,Se,Te), (Cu, Ag)—(Al,Ga,In)—(S,Se,Te), (Cu,Ag)—(Si,Sn)—(S,Se,Te), (Cu,Ag)—Zn—(Si,Sn)—(S,Se,Te), and the like. More preferably, the nanoparticles comprise one or more materials selected from binary and ternary alloys of Cu—In, Cu—Ga, In—Ga, (Al,Ga)—In, Cu—(Al,In,Ga), Cu—Zn, Cu—Sn, and Zn—Sn, and binary or ternary or quaternary compounds of Cu—(S,Se), (Al,Ga,In)—(S,Se), Zn—(S,Se), Sn—(S,Se), Cu—(Al,Ga,In)—(S,Se), and Cu—Zn—Sn—(S,Se).

For most applications, the group IB element used in both embodiments is Cu. When selecting materials from the above lists, the atomic ratios or equivalently the molar ratios between the group IB, IIIA, and VIA elements or between group IB and (IIB+IVA) and VIA elements, e.g. Cu:(In+Ga): Se for CIGS and Cu:(Zn+Sn):S for CZTS absorber layers, are carefully adjusted to the predetermined ratio of within a few percent near the ideal chemical composition of the objective photovoltaic absorber layer. Thus, for example, Cu:(In+Ga): Se should have an atomic ratio of approximately 25%:25%: 50% and Cu:(Zn+Sn):(S+Se) approximately at 25%:25%: 50% plus or minus 15%, most preferably plus or minus 5%. The range of 15% to 5% is required for practical reasons. Loss of, for example, Cu or In or Se during the process, especially considering the high vapor pressure of In—Se compounds and of elemental Se requires that the acceptable ratio ranges be extended to plus or minus 15%. In the case in either embodiment where the optional group VIA elements are not present the ratio of group IB (Cu) to IIA elements is 50%:50% and the ratio of group IB (Cu) to (IIB+IVA) elements is also 50%:50%, both ratios preferably plus or minus 5% and acceptably plus or minus up to 15%.

The nanoparticles may also be prepared as a chemical complex. For example, CIGS nanoparticles may be synthesized through various chemical reaction methods as described in the sonochemical method by H. Zhu, Chem. Mater. 12, 73, (2000); thermolysis described by M. A. Malik et. al. Adv. Mat. 11, 1441 (1999); and pyrolysis described by S. L. Castro et. al. Chem. Mater. 15, 3142 (2003) such that the resultant nanoparticle contains the desired chemical composition.

The nanoparticles may have a plurality of shapes including but not limited to nanospheres, nanorods, nanowires, nanocubes, nanoflowers, nanoflakes, mixtures of these shapes and the like, depending on the bulk material properties and fabrication method. The desired size of the nanoparticles suitable for the method of the present invention ranges between about 1 nm and 500 nm in at least one dimension, preferably between about 1 nm and about 100 nm in at least one dimension. According to an embodiment of this invention, a thin oxide layer may be formed on the surface of the nanoparticle, depending on the particle fabrication method and the liquid medium of the colloidal suspension.

According to an embodiment of the present invention, the nanoparticles are prepared by physical breakdown of bulk source materials, wherein the nanoparticles and the bulk materials have an identical chemical composition. The nanoparticles may be prepared in a preferred liquid medium to form the colloid suspension, or they may be prepared in but not limited to, a vacuum, a gas medium, or a liquid medium, and then re-dispersed in a preferred liquid medium to form the colloid suspension. Methods of preparing the nanoparticles include but are not limited to pulsed laser ablation, laser pyrolysis, arc discharge, thermal evaporation, plasma evaporation, evaporation-condensation, and mechanical ball milling of the bulk material. These methods, indicated as the "physical breakdown methods" suitable for this invention, have an advantage of providing easy controllability of the chemical composition of the nanoparticles by simply adjusting the composition of the source bulk material. In addition, the formation of the bulk material can use a plurality of methods not limited by EPD considerations, and therefore much more complex bulk materials can be prepared. The use of physical breakdown of bulk materials allows the EPD process to have better film quality control, maximizes material usage, and at the same time reduces process complexity. By way of contrast, we use "chemical synthesis methods" to denote the particle preparation methods used in prior art EPD processes of Brown and Salt, and U.S. Pat. Nos. 3,879,276, 4,204,933, 4,225,408, and 4,482,933, and in prior art of other non-vacuum deposition techniques such as the sonochemical reaction described by J J. Zhu, Chem. Mater., 12, 73, (2000), thermolysis described by M. A. Malik et al., Adv. Mat., 11, 1441, (1999), pyrolysis described by S. L. Castro et al., Chem. Mater., 15, 3142, (2003), and spray coprecipitation described in U.S. Pat. No. 7,663,057. In these chemical synthesis methods, compositional control of the synthesized nanoparticles is much more challenging since several reactants/precursors, electrolytes, surfactants/dispersants are employed in the process, and each of them may affect the composition of the deposited film individually. In addition, the inactive part of the reactants/electrolytes, usually the anion part, and the residual by-products, surfactants/dispersants or other additives are typically macromolecular compounds that are difficult to fully decompose, or to be fully eliminated from the final product by post-deposition treatments. In the prior art use of EPD, acids and/or bases are commonly employed for altering the pH value and conductivity of the colloidal suspension, e.g. "*Electrophoretic deposition of materials*" Van der Biest and Vandeperre, Annu. Rev. Mater. Sci. 29, 327 (1999). The use of acid/base may induce undesirable formation of by-products, such as $H_2$ and $O_2$ gases, at the electrodes, and interfere with the film deposition. Only by incorporating the physical breakdown method of the present invention into the EPD process as stated in this invention, can one effectively avoid undesirable by-product formation, maximize source material usage, and reduce chemical contaminations in the final product of the invention.

A stable suspension of nanoparticles with surface charges is needed for the EPD process according to the present invention. Migration of these nanoparticles driven by a strong electric force is recognized to be of a physical nature rather than of a chemical nature. The nanoparticles may have a positive surface charge or a negative surface charge depending on the nature of the liquid medium and on the bulk materials from which the nanoparticles are formed. According to an embodiment of the present invention, preferably the surface-charged nanoparticles in a stable suspension have an absolute value of zeta potential greater than 10 milliVolts (mV). Zeta potential ($\zeta$) is used to represent the degree of repulsion between adjacent surface-charged nanoparticles. It is determined from the velocity (v) with which the nanoparticle moves under an electric field (E) according to the following equation: $\zeta=(4\pi\eta v)/(\in E)$, where $\eta$ and $\in$ are the viscosity and dielectric constant of the liquid medium, respectively.

The liquid medium of the colloidal suspension may be one solvent or a mixture of two or more solvents, wherein the solvents include but are not limited to, water and water-miscible organic liquids, preferably single phase polar organic liquids. The polar organic liquid may have a large dielectric constant of more than 10, and more preferably of more than 20. General classes of the polar organic liquids suitable for this invention include but are not limited to, alcohols, ethers, ketones, esters, amides, nitriles, and diols, and the like. Preferably the formula of the polar organic liquid contains 1-6 carbon atoms. In some embodiments, a non-aqueous medium is preferred over an aqueous medium, to avoid potential electrolysis of water and gas formation at the electrodes, which may interfere with the deposition process.

Some embodiments may employ one or more suitable additives to improve the stability and conductivity of the colloidal suspension, or to improve adhesion of the deposited photovoltaic absorber layer at the absorber layer/substrate interface. Such additives include but are not limited to, acids, bases, electrolytes, and surfactants/dispersants which are well known in the colloidal art. However, in various embodiments, such additives should be removable from the absorber layer during or after deposition. Particularly, additives are chosen to ensure that they do not disadvantage the process or the product of the invention.

Generally, the substrate on which the absorber layer is deposited is electrically conductive or semi-conductive, and is directly connected to or is the deposition electrode, wherein the deposition surface faces the counter electrode. The polarity of the deposition electrode, either positive or negative, is determined as an opposite charge to the charge polarity of the nanoparticles. The substrate also acts as the bottom contact in a photovoltaic device. It may be in the form of, but is not limited to: (1) a rigid sheet of glass with a conductive coating, preferably a metal coating and more preferably a molybdenum coating; (2) a flexible sheet of a metal or an alloy, including but not limited to molybdenum, titanium, stainless steel, or aluminum, with or without additional coatings; or (3) a flexible polymeric sheet having a conductive coating, preferably a metal coating and more preferably a molybdenum coating. The suitable polymers for forming the polymeric sheet include, but are not limited to, polyimides, polyethylene terephthalate, or polyethersulphone. In embodiments wherein a metal or an alloy substrate is used, it would be desirable but not necessary to cover the backside of the substrate with a blocking material such as an insulating tape or membrane to inhibit useless deposition on the back side of the substrate. It would also be desirable to pre-coat a thin layer of molybdenum and/or an intermediate blocking layer on the metal sheet to improve adhesion and inhibit interdiffusion between the metal substrate and the deposited film as described in U.S. patent publication no. 2009/0305455.

The counter electrode is typically made of either a conductive metal or a conductive alloy, including but not limited to, stainless steel, molybdenum, nickel, titanium, platinum, gold, or a metal-coated glass sheet. Unlike the deposition electrode substrate, which is typically in planar shape for photovoltaic applications, the shape of the counter electrode may be deliberately altered to change the electric field distribution. When the counter electrode is also a planar sheet, although the electric field between planar electrodes is uniform, the deposited film is usually non-uniform, e.g. thinner at the center and thicker at the edge of the substrate. This phenomenon is more apparent when the distance between the two electrodes is decreased to obtain a stronger electrical field. This phenomenon is due to the small spacing limiting the number of nanoparticles that are able to migrate to the center of the substrate for deposition. To ensure uniform coating on the deposition electrode, the counter electrode may be configured in the form of a mesh or a sheet with hollow center areas. FIG. 2 illustrates one embodiment of the current invention wherein a counter electrode with rectangular-shaped holes is employed.

The voltage applied to the electrodes, the distance between the electrodes, and the current density employed on the electrodes may be configured in light of the intensity of the electric field required for the deposition of the nanoparticles. Depending on the nanoparticle properties and electrode size, the applied voltage may be direct current (DC) or alternating current (AC) and may be either continuous or pulsed. The electrical potential is preferably from 1 to 1000 Volts (V), more preferably from 50 to 500 V. The distance between the electrodes is preferably from 0.1 to 100 centimeters (cm), more preferably from 0.5 to 10 cm. The current density is preferably from 0.001 to 10 milliAmps/centimeter$^2$ (mA/cm$^2$), more preferably from 0.01 to 1 mA/cm$^2$.

The deposition speed is determined by the operating parameters. In some embodiments, a 0.5 to 2 micron (μm) thick film with a good packing density may be deposited by the current method in a short time of from 30 seconds to 5 minutes. The deposition speed of the current method is much faster than the conventional vacuum-based techniques, and is among the fastest compared to other non-vacuum-based techniques in terms of depositing a thin film photovoltaic absorber layer with similar packing density.

According to an embodiment of the present invention, virtually all of the nanoparticles in the liquid medium may be deposited under an optimized configuration of the EPD process onto the substrate. Thus, the material usage is much more efficient in the current method compared to the conventional vacuum-based and other non-vacuum-based techniques. Therefore, the current method helps to reduce the environmental footprint of the process of forming a photovoltaic absorber layer.

Figure 4:
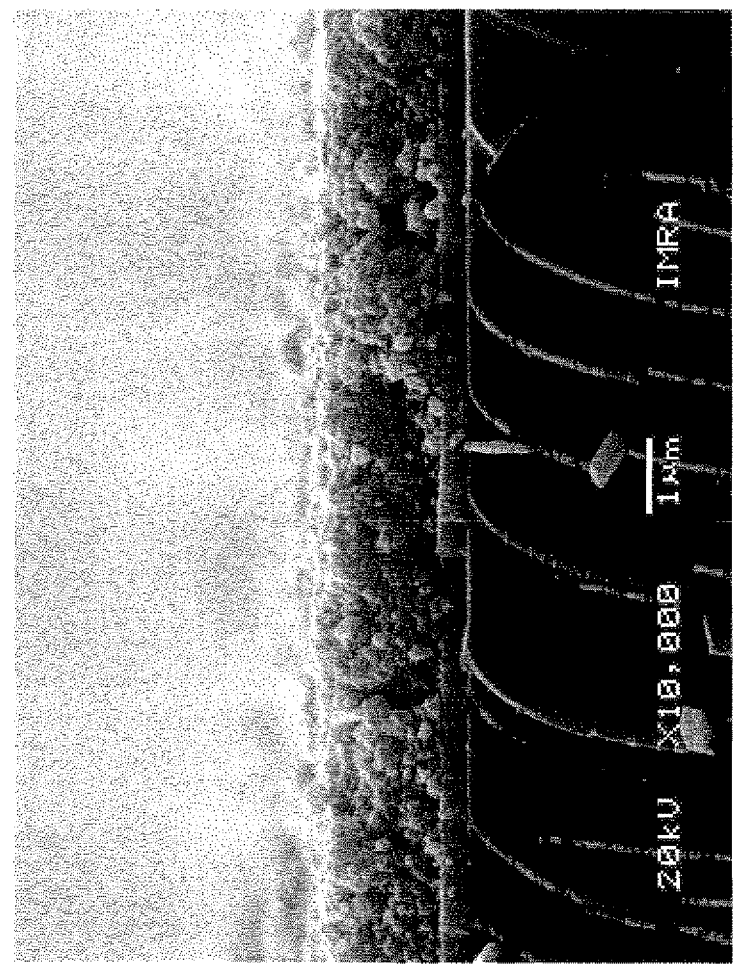
FIG. 4 is a scanning electron microscopy image showing a cross-sectional view of a Cu—In alloy photovoltaic absorber layer prepared according to an embodiment of the present invention.
Figure 5:
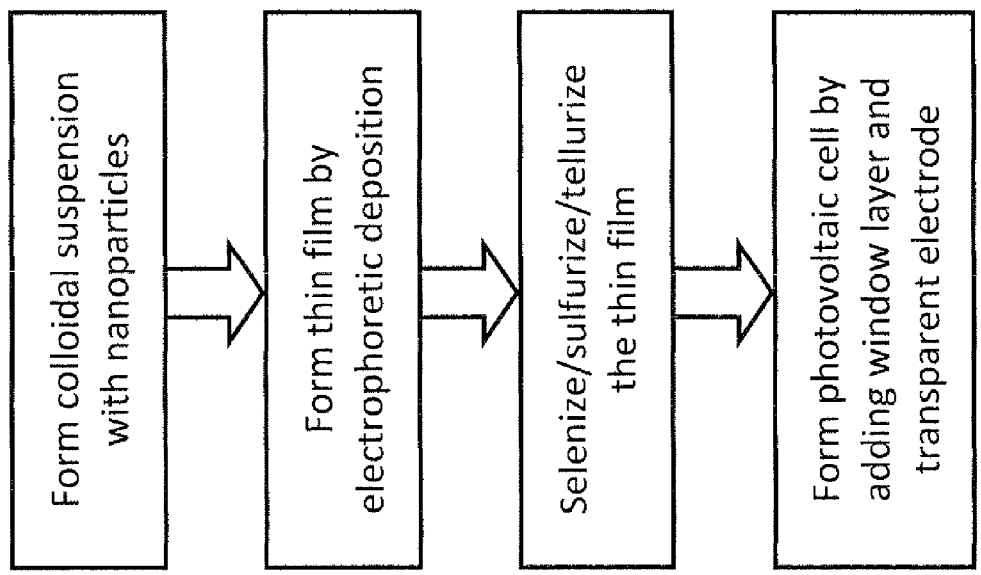
FIG. 5 is a flow diagram illustrating a process of fabricating a photovoltaic cell according to an embodiment of the present invention.

By way of an example, FIG. 4 displays a cross-sectional scanning electron microscopy image of a Cu—In alloy film of 1.5 μm thickness deposited on a molybdenum coated glass substrate according to the current method. Pulsed laser ablation was employed to generate the Cu—In alloy nanoparticles in acetone. The laser pulse repetition rate was preferably about 500 kilo-Hertz. The pulse energy was preferably about 8 micro-Joule. The ultrashort laser pulse duration is preferably between 0.1 to 1 picosecond. The target ablated by the laser was a commercial sputtering target purchased form SCI Engineering Materials Inc. containing 50% Cu and 50% In. The size of the ablated nanoparticles ranged between about 1 nm and 500 nm in diameter. The nanoparticles were deposited by EPD under an applied DC voltage of about 400 V, with a current density of about 0.2 mA/cm$^2$. The distance between the electrodes was about 1 cm. To qualify for photovoltaic application, the film deposited by the current method generally requires further post-deposition treatment of chalcogenization, including but not limited to selenization or sulfurization or tellurization, and/or annealing as illustrated in the flow chart of FIG. 5. Chalcogenization will transform the initially deposited absorber layer into an absorber layer with the desired structure of a chalcopyrite or a kesterite, or improve the film structural quality and optical and electrical properties if the initially deposited layer already has the desired structure. By way of an example, the film may be selenized by exposing the layer to a selenium vapor at a temperature of between 400 and 550° C. for 5 to 60 minutes.

Figure 6:
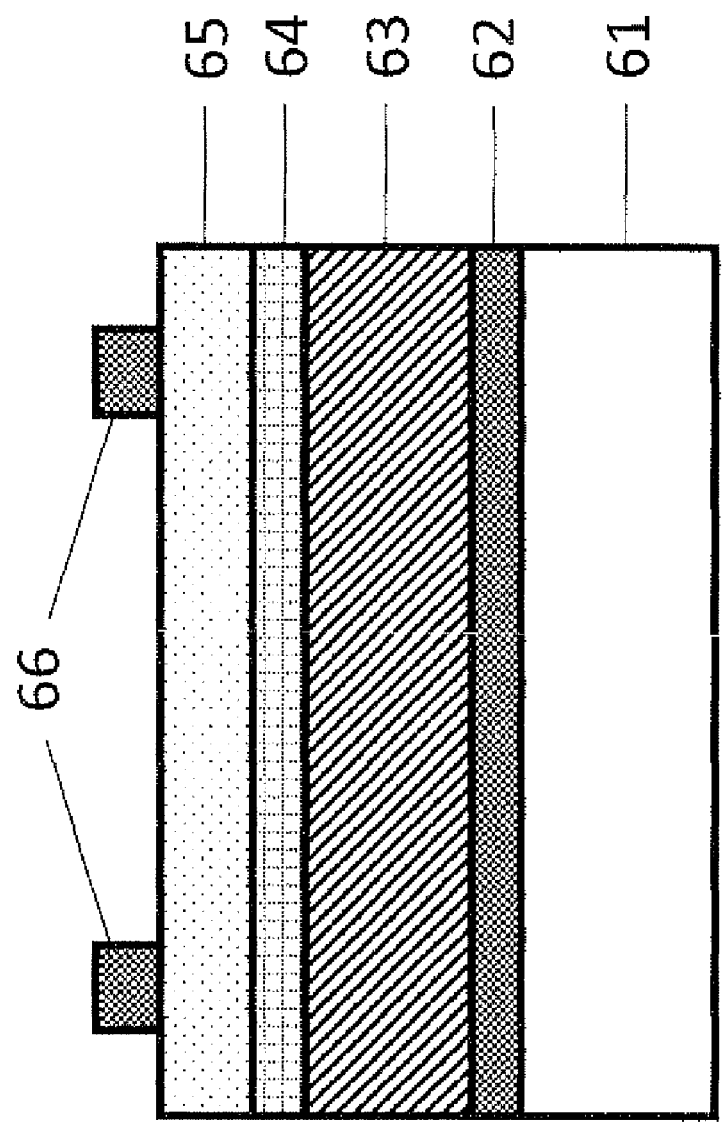
FIG. 6 is a schematic diagram showing a photovoltaic cell designed according to an embodiment of the present invention.

FIG. 6 is a schematic diagram showing the structure of a photovoltaic cell designed according to an embodiment of the present invention, comprising a supporting substrate 61 of glass coated with a back electrode 62 of a molybdenum layer, an IB-IIIA-VIA or IB-IIB-IVA-VIA photovoltaic absorber layer 63 obtained using the method of the present invention, a window layer 64 of cadmium sulfide (CdS), a transparent electrode 65 of zinc oxide (ZnO) and/or aluminum doped zinc oxide (Al—ZnO), and a top contact 66 of nickel, aluminum, or other metal. The window layer 64 is typically deposited by a chemical bath deposition with a thickness of about 50 nanometers. The transparent electrode 65 and the top contact 66 are typically deposited by sputtering or evaporation.

The method for fabricating a photovoltaic absorber layer according to the present invention has excellent reproducibility and stability. The present invention may also be used to fabricate other devices including photodetectors, photoelectrochemical cells, solid oxide fuel cells, supercapacitors, ceramic matrix/fiber composites and other energy conversion or energy storage devices.

The foregoing invention has been described in accordance with the relevant legal standards, thus the description is exemplary rather than limiting in nature. Variations and modifications to the disclosed embodiment may become apparent to those skilled in the art and do come within the scope of the invention. Accordingly, the scope of legal protection afforded this invention can only be determined by studying the following claims.

What we claim is:

1. A method for fabricating a thin film photovoltaic absorber layer comprising the steps of:
    a) providing nanoparticles comprising a combination of either Cu and one or more group IIIA elements, and optionally one or more group VIA elements or a combination of Cu and one or more group IIB and one or more group IVA elements, and optionally one or more group VIA elements of the periodic table, wherein further comprises forming the nanoparticles by a physical breakdown of a bulk material and wherein the nanoparticles have an identical atomic ratio between the elements as the bulk material;
    b) preparing a colloidal suspension of a mixture of the nanoparticles in a liquid medium, wherein the atomic ratio between Cu and group IIIA and optional group VIA elements and between Cu and group IIB and group IVA elements and optional group VIA elements are predetermined; and
    c) submerging a substrate and a counter electrode into the colloidal suspension and depositing the mixture of nanoparticles onto the substrate to form a thin film photovoltaic absorber layer by electrophoretic deposition, wherein the predetermined atomic ratio between Cu and group IIIA and optional group VIA elements or between Cu and (group IIB plus group IVA elements) and optional group VIA elements is 25%:25%:50% plus or minus 15%.

2. The method of claim 1 wherein step a) comprises providing nanoparticles selected from the group consisting of copper (Cu), indium (In), aluminum (Al), gallium (Ga) selenium (Se), and sulfur (S).

3. The method of claim 1 wherein step a) comprises providing nanoparticles selected from the group consisting of copper (Cu), zinc (Zn), tin (Sn), selenium (Se), and sulfur (S).

4. The method of claim 1 wherein step a) comprises providing nanoparticles comprising one or more materials selected from the group consisting of binary or ternary alloys of Cu—In, Cu—Ga, In—Ga, (Al,Ga)—In, Cu—(Al,In,Ga), Cu—Zn, Cu—Sn, Zn—Sn, and from binary, ternary, or quaternary compounds of Cu—(S,Se), (Al,Ga,In)—(S,Se), Zn—(S,Se), Sn—(S,Se), Cu—(Al,Ga,In)—(S,Se), and Cu—Zn—Sn—(S,Se).

5. The method of claim 1 wherein the nanoparticles are formed by pulsed laser ablation of the bulk material.

6. The method of claim 1 wherein the nanoparticles are formed by thermal evaporation of the bulk material.

7. The method of claim 1 wherein the nanoparticles are formed by arc discharge of the bulk material.

8. The method of claim 1 wherein the nanoparticles are formed by plasma evaporation of the bulk material.

9. The method of claim 1 wherein the nanoparticles are formed by mechanical ball milling of the bulk material.

10. The method of claim 1 wherein step a) comprises providing nanoparticles having shapes of a nanosphere, a nanorod, a nanowire, a nanocube, a nanoflower, a nanoflake, or mixtures thereof.

11. The method of claim 1 wherein step a) comprises providing nanoparticles having at least one dimension that is 500 nanometers or less.

12. The method of claim 11 wherein step a) comprises providing nanoparticles having at least one dimension that is 100 nanometers or less.

13. The method of claim 1 wherein step a) comprises providing nanoparticles that have been formed in at least one of a vacuum, a gas medium, or a liquid medium.

14. The method of claim 1 wherein step b) comprises selecting a liquid medium comprising water.

15. The method of claim 1 wherein step b) comprises selecting a liquid medium comprising at least one water-miscible organic solvent having 1-6 carbon atoms and a dielectric constant of more than 10.

16. The method of claim 1 wherein step b) comprises selecting a liquid medium comprising at least one water-miscible organic solvent having 1-6 carbon atoms and a dielectric constant of more than 20.

17. The method of claim 1 wherein step b) further comprises adding to the liquid medium at least one of an acid, a base, an electrolyte, a surfactant, and a dispersant.

18. The method of claim 1 wherein step c) comprises selecting as the substrate one of a sheet of glass with a conductive coating on it; a polymeric sheet with a conductive coating on it; or a sheet comprising at least one of molybdenum, titanium, stainless steel, or aluminum, with or without additional coatings on it.

19. The method of claim 1 wherein step c) further comprises covering a backside of the substrate with a blocking material.

20. The method of claim 19 further comprising selecting as the blocking material a material comprising an insulating tape or membrane.

21. The method of claim 1 wherein step c) comprises selecting as the counter electrode one made of a metal, an alloy, or a metal-coated glass.

22. The method of claim 1 wherein step c) comprises selecting as the counter electrode one that is in the form of a planar sheet, a mesh, or a sheet with hollow center areas.

23. The method of claim 1 further comprising the step of subjecting the thin film photovoltaic absorber layer to one or more steps of chalcogenization and annealing.

* * * * *